United States Patent [19]

Allman et al.

[11] Patent Number: 5,308,790
[45] Date of Patent: May 3, 1994

[54] SELECTIVE SIDEWALL DIFFUSION PROCESS USING DOPED SOG

[75] Inventors: Derryl D. J. Allman; Gayle W. Miller, both of Colorado Springs, Colo.

[73] Assignee: NCR Corporation, Dayton, Ohio

[21] Appl. No.: 961,967

[22] Filed: Oct. 16, 1992

[51] Int. Cl.$^5$ .......................................... H01L 21/225
[52] U.S. Cl. .................... 437/164; 437/158; 437/231; 148/DIG. 31; 257/263; 257/302
[58] Field of Search ............... 437/164, 152, 158, 231; 148/DIG. 31; 257/263, 302, 328

[56] References Cited

U.S. PATENT DOCUMENTS

| | | | |
|---|---|---|---|
| 3,928,225 | 12/1975 | Schäfer | 252/182 |
| 4,355,454 | 10/1982 | Tasch, Jr. et al. | 29/571 |
| 4,433,008 | 2/1984 | Schnable et al. | 427/85 |
| 4,455,325 | 6/1984 | Razouk | 427/85 |
| 4,571,366 | 2/1986 | Thomas et al. | 428/446 |
| 4,603,468 | 8/1986 | Lam | 29/571 |
| 4,606,114 | 8/1986 | Kraus | 29/571 |
| 4,628,589 | 12/1986 | Sundaresan | 29/571 |
| 4,661,177 | 4/1987 | Powell | 148/189 |
| 4,755,486 | 7/1988 | Treichel et al. | 437/164 |
| 4,782,036 | 11/1988 | Becker et al. | 437/164 |
| 4,835,113 | 5/1989 | Celler et al. | 437/37 |
| 4,837,179 | 6/1989 | Foster et al. | 437/44 |
| 4,889,492 | 12/1989 | Bardin et al. | 437/15 |
| 4,891,331 | 1/1990 | Rapp | 437/164 |
| 4,996,168 | 2/1991 | Ozaki et al. | 437/164 |
| 5,024,959 | 6/1991 | Pfiester | 437/34 |
| 5,028,564 | 7/1991 | Chang et al. | 437/158 |
| 5,047,359 | 9/1991 | Eklund | 437/31 |
| 5,116,778 | 5/1992 | Haskell et al. | 437/57 |

FOREIGN PATENT DOCUMENTS

| | | |
|---|---|---|
| 0367729 | 5/1990 | European Pat. Off. ............ 437/164 |
| 53-135263 | 11/1978 | Japan . |
| 57-194525 | 11/1982 | Japan . |
| 61-87322 | 5/1986 | Japan . |
| 62-60220 | 3/1987 | Japan . |
| 62-216322 | 9/1987 | Japan . |
| 1-8615 | 1/1989 | Japan . |
| 1-194416 | 8/1989 | Japan . |
| 1-283828 | 11/1989 | Japan . |

OTHER PUBLICATIONS

Wolf, Stanley, "Silicon Processing for the VLSI Era: vol. 2", Lattice Press, Sunset Beach, Calif. (1990) pp. 229–233.

*Primary Examiner*—Olik Chaudhuri
*Assistant Examiner*—Ken Horton
*Attorney, Agent, or Firm*—Paul W. Martin

[57] ABSTRACT

A selective sidewall diffusion process using doped SOG. A substrate is processed to form raised portions or pedestals, having sidewalls, and trenches. A first layer, either a doped SOG layer or undoped oxide layer, may be deposited onto the substrate adjacent the sidewalls. The first layer is densified. A second layer may be deposited on the first layer. The second layer is a doped SOG layer. The second layer is densified and the dopant is driven into the sidewalls to form shallow junctions.

15 Claims, 2 Drawing Sheets

SELECTIVE SIDEWALL DIFFUSION PROCESS USING DOPED SOG

CROSS REFERENCE TO RELATES APPLICATIONS

The present invention is related to the following commonly assigned and co-pending U.S. applications, which have been filed concurrently with the present application:

"Shallow Junction SOG Process", invented by Allman et al., and having a U.S. Ser. No. 07/965,822;

"Method for Forming a Bipolar Emitter Using Doped SOG", invented by Allman et al., and having a U.S. Ser. No. 07/961,973;

"Bipolar Transistor Formation Using Doped SOG", invented by Allman et al., and having a U.S. Ser. No. 07/965,823; and "Global Planarization Using Doped SOG and Chemical Metal Polish", invented by Allman et al., and having a U.S. Ser. No. 07/965,309.

BACKGROUND OF THE INVENTION

The present invention relates to methods for producing integrated circuit devices and more specifically to a selective sidewall diffusion process using doped spin on glass (SOG).

Known methods for diffusing impurities into planar semiconductor materials involve a masking operation followed by an implant operation in which n-type and p-type impurities are implanted into a planar substrate, typically silicon.

No known method exists for diffusing impurities into the sidewalls of depressions or raised portions of semiconductor materials. Implanting does not work well for sidewall diffusion because the implanting process is highly directional. The surface to be implanted must be oriented perpendicular to the direction from which the implanting is performed. During the implanting process, it is not feasible to rotate the semiconductor material in many directions to expose the various surfaces of the material to implanting. Surrounding surface structures may shadow adjacent structures, making side wall implantation impossible.

Furthermore, if a high energy implant is used to introduce the same dopant species to the same depth in the silicon, two detrimental effects will occur. First, the dopant would be introduced into the surface region of the silicon. Second, the implant would cause crystal lattice defects in the silicon.

Therefore, it would be desirable to provide a process for forming diffusing impurities into the sidewalls of depressions or raised portions of semiconductor materials.

SUMMARY OF THE INVENTION

In accordance with the teachings of the present invention, a selective sidewall diffusion process using doped SOG is provided. A substrate is processed to form raised portions or pedestals, having sidewalls, and trenches. A first layer, such as undoped silicon oxide or doped SOG, may be deposited onto the substrate adjacent the sidewalls. The first layer is densified. A second layer of doped SOG may be deposited on the first layer. The second layer is densified and the dopant is driven into the sidewalls to form junctions.

A semiconductor device is also disclosed which includes a substrate including a raised portion having a doped sidewall, a first layer of either undoped semiconductor oxide or doped SOG on the substrate adjacent the sidewall, and an optional second doped SOG layer on the first layer adjacent the sidewall. Heating of the device produces diffusion areas in the sidewalls. In the preferred embodiment, the raised portion is substantially rectangular in shape, although other shapes are also envisioned.

It is accordingly an object of the present invention to provide a selective sidewall diffusion process using doped SOG.

It is another object of the present invention to provide a semiconductor device formed from the method of the present invention.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings in which:

DETAILED DESCRIPTION OF THE PREFERRED EMBODIMENT

Figure 1:
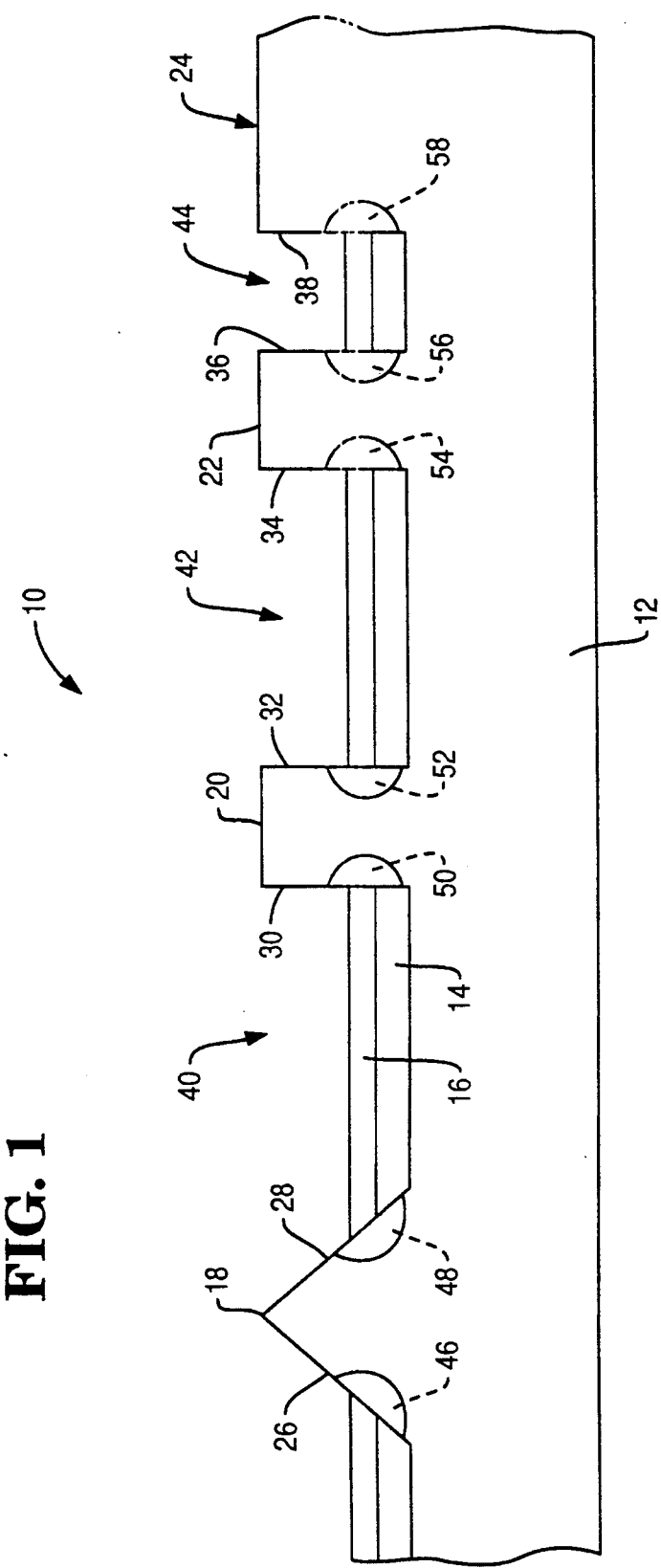
FIG. 1 is a cross-sectional view of a semiconductor device containing depressions and raised portions whose sidewalls have received diffused impurities under the method of the present invention.

Referring now to FIG. 1, a semiconductor device 10 manufactured using the method of the present invention is shown. Device 10 includes underlying semiconductor substrate 12, followed by a layer 14 of undoped SOG, and a layer 16 of doped SOG.

Figure 2:
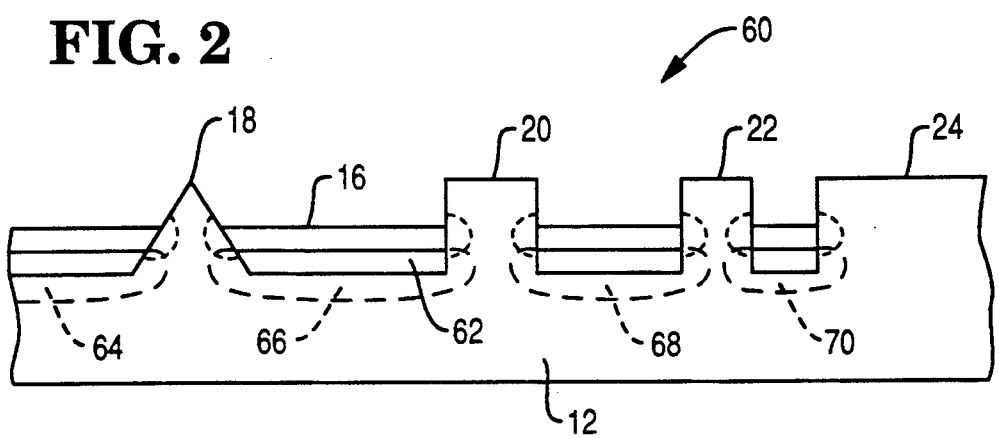
FIG. 2 is a cross-sectional view of a second semiconductor device containing depressions and raised portions whose sidewalls have received diffused impurities under the method of the present invention.
Figure 3:
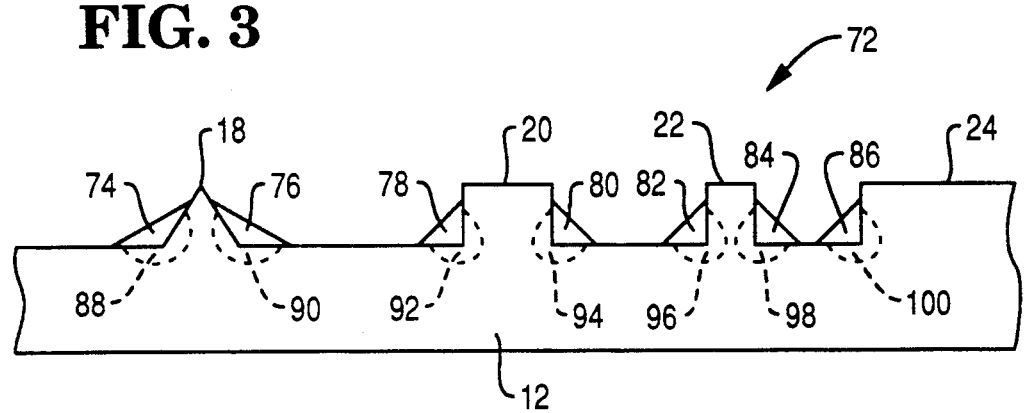
FIG. 3 is a cross-sectional view of a third semiconductor device containing depressions and raised portions whose sidewalls have received diffused impurities under the method of the present invention.
Figure 4:
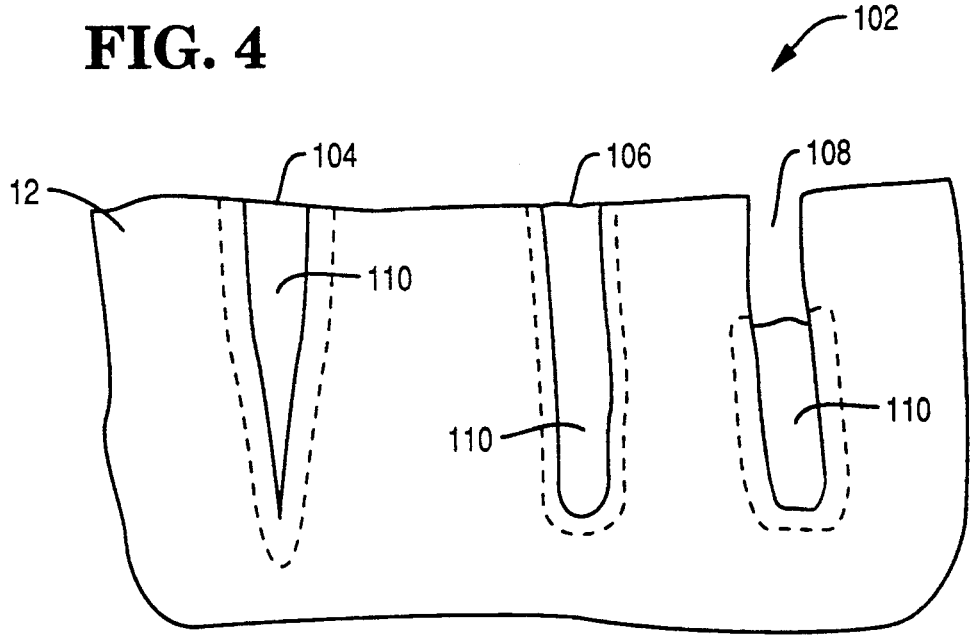
FIG. 4 is a cross-sectional view of a fourth semiconductor device containing depressions and raised portions whose sidewalls have received diffused impurities under the method of the present invention.

Substrate 12 includes raised portions or pedestals 18-24, which have sidewalls 26-38, and trenches 40-44. Pedestals 18-24 may be formed by a plasma etch process, wet etch process, or by a selected epitaxial growth (SEG) process, all known in the art. Trenches 40-44 may be formed using a plasma etch process or a wet etch process. Pedestals 20 and 22 are rectangular pedestals which are preferably no wider than about 1.5 microns. The distance between pedestals 20 and 22 is preferably less than about 2 microns. Trench 44 is rectangular in shape. Pedestal 18 is triangular in shape. While rectangular and triangular pedestal and trench geometries have been disclosed, other geometries are also equally envisioned for use with the present invention (FIGS. 2-4).

Undoped silicon layer 14 is spun onto the surface to a thickness of preferably 1000 to 5000 angstroms. Undoped SOG is employed to prevent diffusion of dopants or other impurities into substrate 12. If single-sidewall diffusion is desired, layer 14 may be applied so as to mask the sidewall to be protected from diffusion.

Layer 14 is densified to cross-link the polymers within layer 14 and drive out low temperature boiling point solvents by heating layer 14 in a furnace containing a nitrogen atmosphere at about 600 to 1200 degrees Celsius. Heating time is preferably about 30 minutes to 3 hours. Alternatively, a rapid thermal process (RTP) may also be employed to heat layer 14 for about 10 to 70 seconds. Substrate 12 may be any semiconductor material, including silicon.

Diffusion areas 46-58 contain dopants diffused from layer 16. Single-sidewall diffusion, as well as double-sidewall diffusion, is envisioned by the present invention.

Doped SOG layer 16 is spun onto layer 14 at a thickness of preferably about 500 to 5000 angstroms. The choice of dopants may vary and depends upon the semiconductor material of substrate 12. When silicon is used to form wafer 12, the dopants may be boron, phosphorus, arsenic, or antimony.

Layer 16 is densified, and the dopant is driven out of layer 16 and into pedestals 18-24 by heating, using another furnace cycle or RTP cycle at preferably about 1000 to 1150 degrees Celsius. If layer 14 is doped, the dopants from layer 14 are also driven into pedestals 18-24. If a furnace cycle is employed, the heating time is preferably about 30 minutes to 3 hours. If an RTP cycle is employed, heating time is preferably about 20 to 9000 seconds.

So long as the width of pedestals 20 and 22 do not exceed about 1.5 microns and layer 16 does not exceed about 5000 angstroms, layer 16 will not coat out on top of pedestals 20 and 22. A layer of SOG on top of pedestals 20 and 22 is undesirable because it prevents diffusion of impurities into the underlying pedestal. If the thickness of pedestals 20 and 22 exceeds 1.5 microns, then the SOG on top of pedestals 20 and 22 may be removed by a plasma etch process, leaving most of the SOG in trenches 40-44.

Referring now to FIG. 2, device 60 similar to device 10 is shown. Device 60 includes a doped SOG layer 62 instead of undoped SOG layer 14 to provide double dopant diffusion. Dopants from layer 62 diffuse into underlying substrate 12 to produce diffusion areas 64-70.

Layer 62 should be spun at a thickness of about 3000 to 7000 angstroms and cured at a temperature of about 300 to 700 degrees Celsius in an oxygen atmosphere for about five minutes to several hours in a furnace. Alternatively, an RTP cycle may be employed over the same temperature range, but for about 10 to 300 seconds. The cure step is performed to remove carbon so that it will not be driven into silicon substrate 12.

Referring now to FIG. 3, another device 72 is shown. Device 72 is similar to device 10, except that only one layer, a doped SOG layer, is deposited and etched away. Device 72 includes doped SOG portions 74-86, which remain after etching, to implement corner and sidewall diffusion. Dopants from SOG portions 74-86 diffuse into underlying substrate 12 to produce diffusion areas 88-100.

The thickness of the SOG layer prior to etch and the baking temperature (prior to a final cure) are set to cause the spun SOG layer to pile up in the corners. A plasma etch is employed to etch back the SOG layer without etching substrate 12 in order to leave SOG portions 74-86 behind.

Referring now to FIG. 4, another device 102 is shown. Device 102 includes trenches 104-108, filled or partially filled with doped SOG 110. Dopants from SOG 110 diffuse into the sidewalls of trenches 104-108. Dynamic read-only-memory (DRAM) devices employ such trenches as capacitors for storing charge in the sidewalls. Doping the sidewalls will confine the storage charge to the DRAM interface and reduce the capacitive load on the storage capacitor.

Although the present invention has been described with particular reference to certain preferred embodiments thereof, variations and modifications of the present invention can be effected within the spirit and scope of the following claims.

What is claimed is:

1. A method for doping a sidewall of a raised portion of a semiconductor substrate comprising the steps of:
   depositing an insulating layer only on the substrate adjacent the sidewall, the insulating layer having an end adjacent the sidewall;
   depositing a layer of SOG containing a dopant only on the insulating layer adjacent the sidewall, the doped SOG layer having an end adjacent the sidewall; and
   driving the dopant from the SOG layer only into the sidewall to form a junction area at the ends of the insulating layer and the SOG layer, the junction area having a depth less than the length of the sidewall.

2. The method as recited in claim 1, further comprising the step of:
   densifying the doped SOG layer before the step of driving.

3. The method as recited in claim 1, further comprising the step of:
   densifying the insulating layer before the step of depositing the layer of SOG.

4. The method as recited in claim 1, wherein the dopant comprises boron.

5. The method as recited in claim 1, wherein the dopant comprises phosphorus.

6. The method as recited in claim 1, wherein the dopant comprises arsenic.

7. The method as recited in claim 1, wherein the dopant comprises antimony.

8. The method as recited in claim 1, wherein the insulating layer comprises undoped silicon oxide.

9. The method as recited in claim 1, wherein the step of driving comprises the substep of:
   heating the SOG layer in a furnace to a temperature within the range of about 1000 degrees Celsius to about 1150 degrees Celsius for about 30 minutes to about 3 hours.

10. The method as recited in claim 1, wherein the step of driving comprises the substep of:
    heating the SOG layer to a temperature within the range of about 1000 degrees Celsius to about 1150 degrees Celsius for about 20 to about 9000 seconds in an RTP cycle.

11. The method as recited in claim 1, wherein the step of depositing a layer of SOG comprises the substep of:
    removing SOG from the raised portion.

12. The method as recited in claim 1, wherein the insulating layer comprises:
    an undoped SOG layer.

13. The method as recited in claim 12, further comprising the step of:
    densifying the undoped SOG layer before the step of depositing the doped SOG layer.

14. A method for doping a sidewall of a raised portion of a semiconductor substrate comprising the steps of:

depositing an insulating layer only on the substrate adjacent the sidewall, the insulating layer having an end adjacent the sidewall;

densifying the insulating layer;

depositing a layer of doped SOG containing a dopant only on the insulating layer adjacent the sidewall, the doped SOG layer having an end adjacent the sidewall;

densifying the doped SOG layer; and driving the dopant from the SOG layer only into the sidewall to form a junction area at the ends of the insulating layer and the SOG layer, the junction area having a depth less than the length of the sidewall.

15. A method for doping a sidewall of a raised portion of a semiconductor substrate comprising the steps of:

depositing a first doped SOG layer on the substrate;

depositing a second doped SOG layer on the first SOG layer adjacent the sidewall;

densifying the first and second doped SOG layers; and driving the dopants from the first and second SOG layers into the sidewall.

* * * * *